United States Patent [19]

Ahern et al.

[11] Patent Number: 4,681,995

[45] Date of Patent: Jul. 21, 1987

[54] HEAT PIPE RING STACKED ASSEMBLY

[76] Inventors: Brian S. Ahern, 69 Middle Rd., Boxboro, Mass. 01719; Joseph A. Adamski, 468 Central St., Framingham, Mass. 01701

[21] Appl. No.: 848,179

[22] Filed: Apr. 4, 1986

[51] Int. Cl.[4] .............................................. H05B 6/10
[52] U.S. Cl. ................................ 219/10.51; 219/10.65; 219/301; 219/10.75; 165/104.23; 165/104.26; 165/1
[58] Field of Search ................ 219/10.51, 10.49 R, 219/10.57, 10.67, 10.71, 10.75, 10.79, 10.65, 301; 165/104.23, 104.24, 104.26, 137, 1

[56] References Cited

U.S. PATENT DOCUMENTS

| | | | |
|---|---|---|---|
| 2,907,857 | 10/1959 | Monday | 219/10.51 |
| 3,229,759 | 1/1966 | Grover | 165/105 |
| 3,485,296 | 12/1969 | Lazaridis et al. | 165/105 |
| 3,498,369 | 3/1970 | Levedahl | 165/105 |
| 3,602,297 | 8/1971 | Kraft et al. | 165/105 |
| 3,677,329 | 7/1972 | Kirkpatrick | 165/104.26 |
| 3,730,373 | 5/1973 | Kozbelt | 219/301 |
| 3,759,443 | 9/1973 | Freggins | 165/104.26 |
| 3,770,047 | 11/1973 | Kirkpatrick et al. | 165/104.26 |
| 3,857,990 | 12/1974 | Steininger | 165/104.26 |
| 3,925,147 | 12/1975 | Kimura | 156/603 |
| 3,967,591 | 7/1976 | Iida | 165/104.26 |
| 3,968,787 | 7/1976 | Basiulis | 165/104.26 |
| 4,015,659 | 4/1977 | Schladitz | 165/105 |
| 4,136,733 | 1/1979 | Asselman et al. | 165/104.26 |
| 4,231,423 | 11/1980 | Haslett | 165/133 |
| 4,314,128 | 2/1982 | Chitre | 219/10.55 B |
| 4,323,748 | 4/1982 | Likins | 219/10.71 |
| 4,372,377 | 2/1983 | Morris | 165/104.26 |
| 4,396,055 | 8/1983 | Mitchell, Jr. | 165/104.23 |
| 4,609,035 | 9/1986 | Haslett et al. | 165/27 |

FOREIGN PATENT DOCUMENTS 737773  6/1980  U.S.S.R. .......... 165/104.23

Primary Examiner—Philip H. Leung
Attorney, Agent, or Firm—Stanton E. Collier; Donald J. Singer

[57] ABSTRACT

A heat pipe ring for use in a crystal growth furnace is ring-shaped with at least one arm thereon and is constructed as one piece. An RF coil for heating a working fluid in said heat pipe is attached about said arm or an electric current can flow from one arm to an oppositely located arm to heat said body. These rings can be stacked and each may have an independently controlled sources of heat. Each heat pipe ring of the present invention has a wall of three layers of refractory material. In the case of working above 1000° C., the working fluid can be lithium and the wall made of a layer of tungsten, a layer of graphite as a spacer, and a layer of silicon carbide. The internal surface on the tungsten layer is knurled to support capillary action. As a result of these features the heat pipe ring is able to survive high temperatures, greater than 1000° C., high pressures, greater than 80 atm, corrosive atmospheres, a high vacuum, and further provides azimuthal symmetry as well as axial temperature gradient profiles when the heat pipes are stacked and independently heated.

5 Claims, 6 Drawing Figures

HEAT PIPE RING STACKED ASSEMBLY

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to semiconductor crystal growth, and, in particular, relates to a device used in an apparatus for crystal growth at high temperatures and pressures.

In order to grow semiconductor crystals of very high quality, a furnace must provide a highly defined temperature gradient that may be adjusted in a desired manner. A heat pipe used in a furnace is disclosed in U.S. Pat. No. 3,677,329. This prior heat pipe includes concentric inner and outer cylindrical metal tubes. The space between the tubes forms an annular chamber (the cavity within the inner tube forms a working space). The surfaces of the tubes disposed within the annular chamber are covered with linings of porous wick material. The two wick linings are spaced apart and joined together by short spacer elements of wick material that are spaced along the length of the tubes. The annular chamber is closed at both ends by annular shaped cover plates which leave the isothermal working space open for easy access from the outside. The annular chamber is evacuated of non-condensable gases, such as air, and contains a vaporizable fluid of sufficient quantity to wet the entire wick material by capillary action. The specific fluid depends upon the operating temperature desired for the heat pipe.

The wick material for the linings and spacer elements may be in the form of sintered metal wire screens, or other porous compacts having voids or openings of capillary size and capable of transporting the vaporizable fluid.

The working space being devoid of working fluid can be used in a furnace to process various articles of manufacture such as semiconductive devices without danger of contamination by the working fluid. In addition, the furnace may be used to provide an isothermal environment for various components requiring uniform thermal distribution with the furnace shaped in conformity therewith.

A metal casting apparatus for making single crystals is described in U.S. Pat. No. 3,770,047. This apparatus has a first annular heat pipe, arranged along a longitudinal axis, and is provided with a heater means such as RF coils for establishing within the first heat pipe a first uniform temperature above the liquidus temperature for the alloy to be cast. A second annular heat pipe is arranged end-to-end with the first one and with means for establishing within the second heat pipe a lower uniform temperature below the solidus temperature of the alloy.

A mold is placed within the first higher temperature heat pipe, with a cooling or chilling means located near the junction of the two heat pipes. Means are provided for moving the two heat pipes together along the longitudinal axis so that the mold effectively moves out of the hotter heat pipe and into the cooler one.

Because the heat pipes are substantially isothermal along their lengths, each with different temperature, the temperature gradient at their junction is rather steep and approaches a step function. The thermal gradient is considerably sharper than that produced by conventional means.

SUMMARY OF THE INVENTION

The present invention comprises a plurality of stacked heat pipe rings heated by either direct resistive heating or by radio frequency (RF) induction heating.

A circular hollow heat pipe ring having a multitude of refractory materials for the layers of the wall has thereon at least one arm. If the ring is physically supported by means other than a device connected to the arm, an RF inductive heating means may be placed about the arm. If the rings are stacked, independent heating means can be attached to each ring so that a desired temperature profile over the combination is obtainable.

In the case of resistive heating means, the heat pipe ring can have two arms thereon for the purpose of connection to an electrical power source. If the rings are stacked, independent power sources may be used for each ring. Additionally, each arm may provide a point of physical connection whereon a support is attached.

In order to isolate the source of heat, the arm or arms are located on the external circumference of the heat pipe ring. This location insures that there are no hot spots on the internal circumference of the heat pipe ring which is in contact with the working space.

The heat pipe ring is constructed on a mandrel being hollow the surface of which is highly knurled so as to allow the heat conducting liquid to flow on the knurled surface that results. A layer of refractory metal such as tungsten is deposited on the mandrel by chemical vapor deposition. Ports are made in the arms and then a chemical solution is inserted therein to dissolve the mandrel. The resulting tungsten tube is prepared for the working fluid such as lithium which is placed inside of the tube through the port which is thereafter sealed.

Additional layers such as carbon and silicon carbide are deposited on the tungsten ring.

It is therefore one object of the present invention to provide a heat pipe ring having unique structures thereon for application of a source of heat.

Another object of the present invention is a heat pipe ring having isolated sources of heat to minimize hot spots.

Another object of the present invention is a heat pipe ring that is stackable.

Another object of the present invention is a heat pipe ring that is azimuthally symmetrical.

Another object of the present invention is a furnace having stacked heat pipes that allow axial heat gradient programming.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
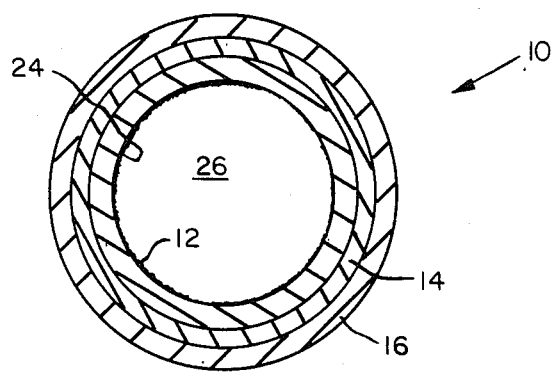
FIG. 1 is a cross section of a heat pipe ring showing the layers therein of the present invention.
Figure 2:
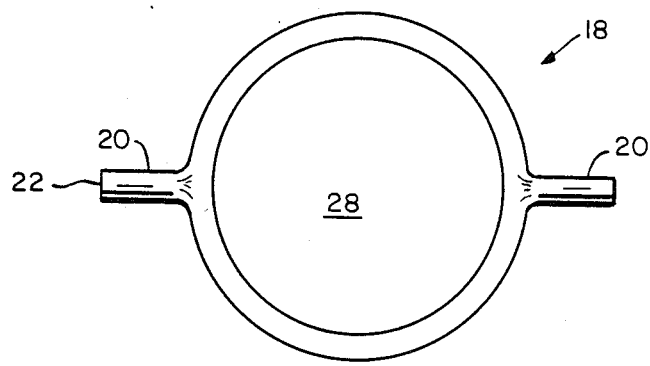
FIG. 2 is a top view of one of the heat pipe ring of the present invention.

Referring to FIG. 1, a cross section of a heat pipe wall 10 is shown having three layers therein such as a first layer 12 of tungsten, a second layer 14 of graphite, and a third layer 16 of silicon carbide. A top view of a heat pipe ring 18 is shown in FIG. 2. Heat pipe ring 18 may have two arms 20 to be described hereinbelow.

The preferred method of this invention is to fabricate a heat pipe using a metal tubular mandrel welded into a desired shape having arm(s) thereon. The diameter of arms 20 need not be of the same outside diameter as ring 18. The outer surface of the metal mandrel, not shown, is knurled to produce a surface having sharp valleys randomly oriented thereon. After this mandrel is prepared, layer 12 of tungsten is deposited thereon using conventional chemical vapor deposition techniques. The thickness of layer 12 must be such that ring 18 is able to withstand high external pressures. A thickness of 0.025" is exemplary.

After the deposition of layer 12, a port 22 is made in arm 20 so that a selected chemical solution can be input to dissolve the mandrel. After ring interior 26 is properly cleaned, a working fluid such as lithium, for temperatures above 1000° C., is placed inside ring 18 and port 22 is sealed by electron beam welding, for example, a small piece of tungsten over port 22.

Referring to FIG. 2, a working space 28 being devoid of working fluid can be used as a furnace to process various articles of manufacture such as semiconductive devices without the danger of contamination by the working fluid. In addition, the furnace may be used to provide an isothermal environment for various components requiring uniform thermal distribution with the furnace shaped in conformity therewith.

A surface 24 being the opposite of that on the mandrel is formed on the inside surface 24 of layer 12. This surface 24 provides the surface upon which the working fluid such as lithium travels by capillary action and condenses. A traditional mesh wick of tungsten is not used in this method. Layer 14 of graphite acts as a spacer between layers 12 and 16 for the purposes of heat isolation and differential expansion of layers 12 and 16.

Layer 16 of silicon carbide is also deposited by chemical vapor/deposition (CVD) to a desired thickness onto layer 14. The reactants may be hydrogen and metholtrichlorosilane at a pressure of 1 atm. During this deposition, layers 12 and 14 are heated to a temperature of about 1300° C.

Figure 3:
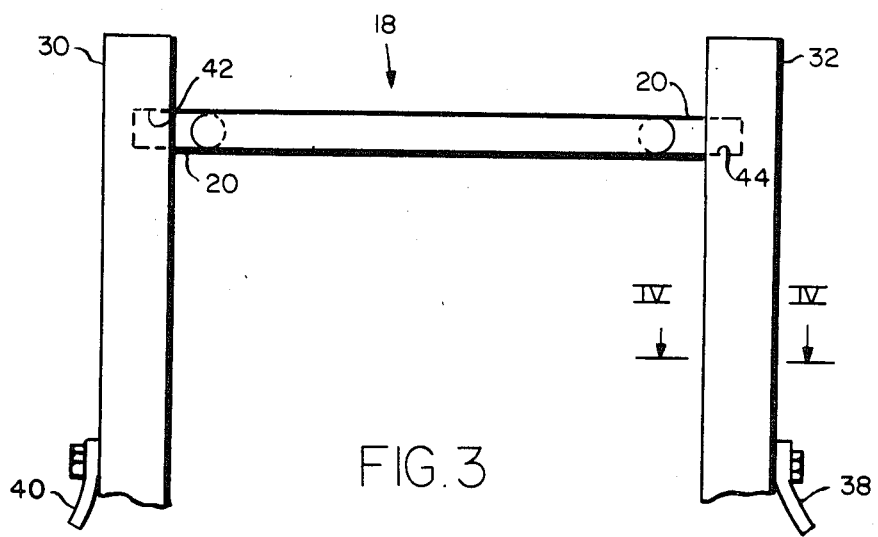
FIG. 3 is a side view showing schematically the manner of connecting a heat pipe ring to supports.
Figure 4:
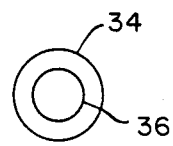
FIG. 4 is a cross section of a support of FIG. 3.

Heat pipe rings 18 may be stacked to provide a selectable temperature profile in the axial direction. FIG. 3 illustrates one ring 18 having two arms 20 mounted into supports 30 and 32. Electric current used for heating in the resistive method flows on supports 30 and 32. An additional feature is the use of water cooling in supports 30 and 32 to remove a non-uni form source of heating. FIG. 4 illustrates support 32 being two tubes 34 and 36 such that water flows up tube 36 and down tube 34. Supports 30 and 32 are connected to electrical leads 38 and 40. For each ring 18 an identical arrangement provides independent physical and electrical connections. Arms 20 are inserted into holes 42 and 44.

Figure 5:
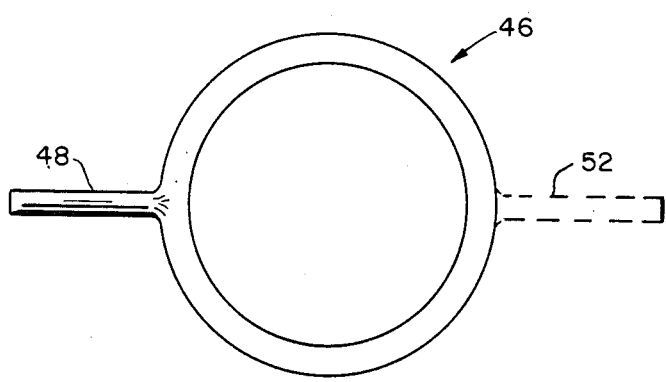
FIG. 5 is a top view of another heat pipe ring of the present invention.
Figure 6:
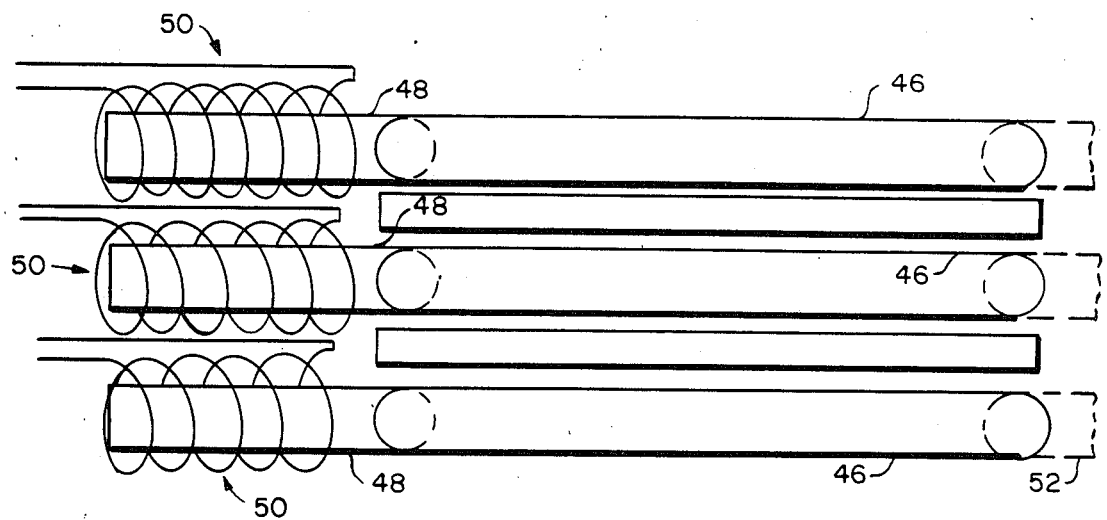
FIG. 6 shows a stacking of the heat pipe rings of FIG. 5 with RF coils thereon.

A one-arm heat pipe ring 46 is shown in FIG. 5 wherein an arm 48 has an RF inductive heating coil 50, FIG. 6, positioned to provide an alternative source of heating. If the physical support of ring 46 can not be attached to arm 48 because of interference with coil 50, a second arm 52 shown in outline can be used for connection to a support, not shown. FIG. 6 illustrates the stacking of three heat pipe rings 48, each RF coil 50 having an independent source of power not shown.

Clearly, many modifications and variations of the present invention are possible in light of the above teachings and it is therefore understood, that within the inventive scope of the inventive concept, the invention may be practiced otherwise than specifically claimed.

What is claimed is:

1. A heat pipe for use in a crystal growth furnace, said heat pipe comprising:
   a ring-shaped tubular body having a wall comprising a plurality of layers of refractory materials, the inside of said tubular body having a means for supporting capillary action of a working fluid placed inside said tubular body; and
   at least one arm attached to said tubular body, said at least one arm being integrally attached to said tubular body on an external circumference and being substantially perpendicular to the axis through the center of said body, said at least one arm communicating with said inside of said tubular body and acting as a secondary heat pipe to convey heated working fluid to said ring-shaped tubular body.

2. A heat pipe as defined in claim 1 wherein said at least one arm has an RF coil connected thereon.

3. A heat pipe as defined in claim 1 wherein said ring-shaped tubular body has two arms, a first and second arm, attached thereto, said first arm being connected to an output of a source of electric current for heating said heat pipe, said second arm outputting said electric current to an input of said source of electric current, said electric current heating said heat pipe.

4. A heat pipe as defined in claim 3 wherein said arms are connected to supports being cooled to prevent non-uniform heating, said arms providing physical support to said ring-shaped tubular body and electrical connection to said ring-shaped tubular body.

5. A heat pipe for use in a crystal growth furnace, said heat pipe comprising:
   a plurality of stacked heat pipe rings, each of said heat pipe rings comprising:
   a ring-shaped tubular body having a wall comprising a plurality of layers of refractory materials, the inside of said tubular body having a means for supporting capillary action of a working fluid placed inside said tubular body; and
   at least one arm attached to said tubular body, said at least one arm being integrally attached to said tubular body on an external circumference and being substantially perpendicular to the axis through the center of said body, said at least one arm communicating with said inside of said tubular body and acting as a secondary heat pipe to convey heated working fluid to said ring-shaped tubular body.

* * * * *